(12) United States Patent
Tai et al.

(10) Patent No.: US 8,431,429 B2
(45) Date of Patent: Apr. 30, 2013

(54) BACKSIDE ILLUMINATED IMAGING SENSOR WITH REINFORCED PAD STRUCTURE

(75) Inventors: Hsin-Chih Tai, San Jose, CA (US); Howard E. Rhodes, San Martin, CA (US); Duli Mao, Sunnyvale, CA (US); Vincent Venezia, Sunnyvale, CA (US); Yin Qian, Milpitas, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 13/554,490

(22) Filed: Jul. 20, 2012

(65) Prior Publication Data
US 2012/0282728 A1 Nov. 8, 2012

Related U.S. Application Data

(62) Division of application No. 12/620,437, filed on Nov. 17, 2009, now Pat. No. 8,247,852.

(51) Int. Cl.
*H01L 31/14* (2006.01)

(52) U.S. Cl.
USPC ............... 438/73; 438/98; 257/447; 257/258; 257/E31.097; 257/E31.121; 257/E31.127

(58) Field of Classification Search .................... 438/73, 438/98; 257/447, 258, E31.097, E31.121, 257/E31.127
See application file for complete search history.

(56) References Cited

U.S. PATENT DOCUMENTS

| | | | |
|---|---|---|---|
| 2005/0104148 A1 | 5/2005 | Yamamoto et al. | |
| 2007/0117253 A1* | 5/2007 | Hsu et al. | 438/75 |
| 2008/0116537 A1 | 5/2008 | Adkisson et al. | |
| 2008/0246152 A1 | 10/2008 | Liu et al. | |
| 2009/0140365 A1 | 6/2009 | Lee et al. | |
| 2010/0045837 A1* | 2/2010 | Yamashita | 348/308 |

OTHER PUBLICATIONS

CN 201010564504.8—First Chinese Office Action, issued Jul. 27, 2012, with English translation (16 pages).
Dulinski, et al., "Tests of a backside illuminated monolithic CMOS pixel sensor in an HPD set-up," Nuclear Instruments & Methods in Physics Research—Section A, Apr. 19, 2005, Elsevier B.V., pp. 274-280.

\* cited by examiner

*Primary Examiner* — Marc Armand
(74) *Attorney, Agent, or Firm* — Blakely Sokoloff Taylor & Zafman LLP

(57) ABSTRACT

A method of fabricating a backside illuminated imaging sensor that includes a device layer, a metal stack, and an opening is disclosed. The device layer has an imaging array formed in a front side of the device layer, where the imaging array is adapted to receive light from a back side of the device layer. The metal stack is coupled to the front side of the device layer and includes at least one metal interconnect layer having a metal pad. The opening extends from the back side of the device layer to the metal pad to expose the metal pad for wire bonding. The method includes depositing a film on the back side of the device layer and within the opening, then etching the film to form a frame within the opening to structurally reinforce the metal pad.

7 Claims, 9 Drawing Sheets

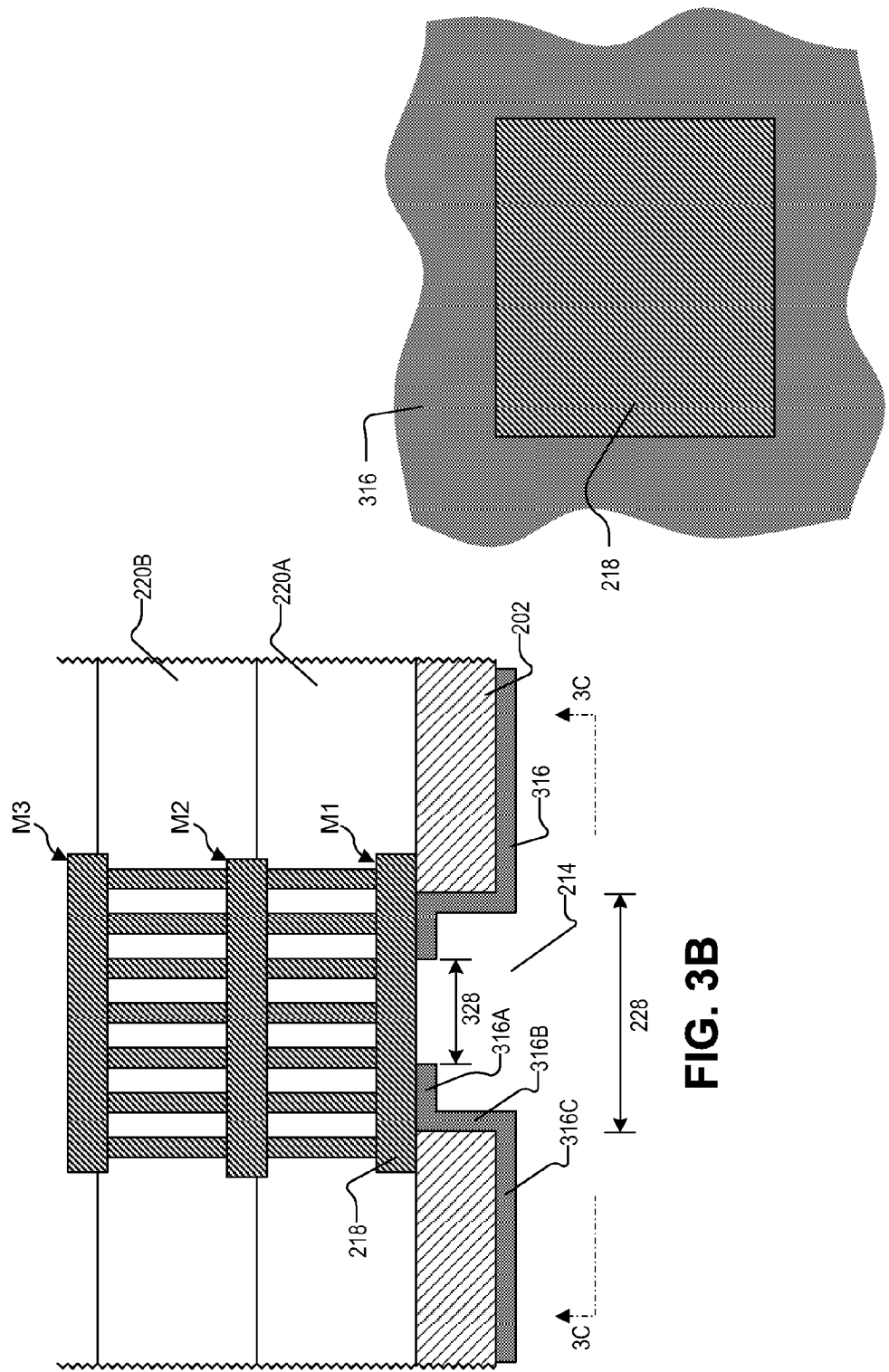

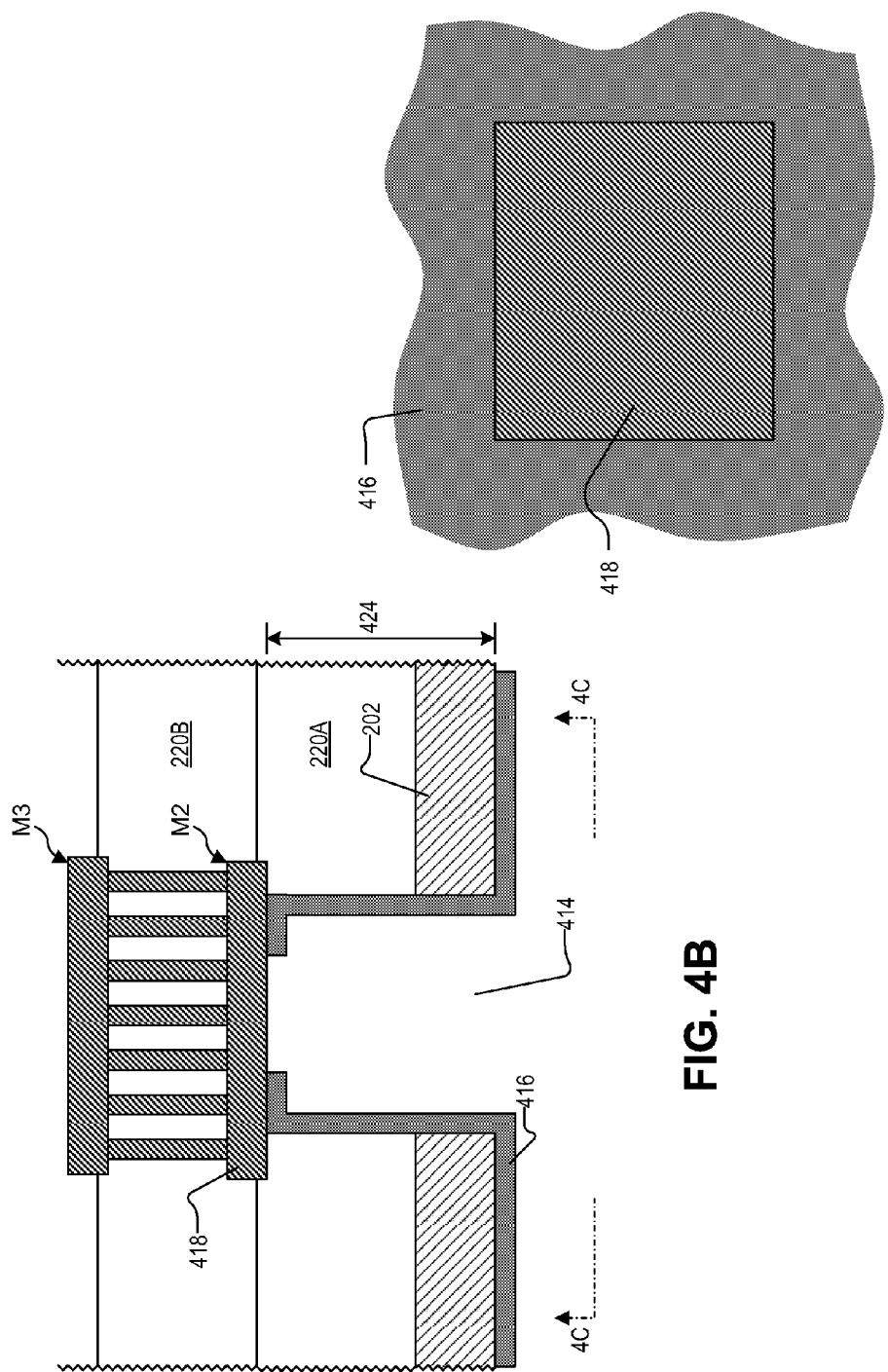

BACKSIDE ILLUMINATED IMAGING SENSOR WITH REINFORCED PAD STRUCTURE

REFERENCE TO PRIOR APPLICATION

This application is a divisional of U.S. application Ser. No. 12/620,437, filed Nov. 17, 2009, now pending. U.S. application Ser. No. 12/620,437 is hereby incorporated by reference.

TECHNICAL FIELD

This disclosure relates generally to imaging sensors, and in particular but not exclusively, relates to backside illuminated imaging sensors.

BACKGROUND INFORMATION

Many semiconductor imaging sensors today are front side illuminated (FSI). That is, they include imaging arrays that are fabricated on the front side of a semiconductor wafer, where light is received at the imaging array from the same front side. However, front side illuminated imaging sensors have many drawbacks, one of which is a limited fill factor.

Backside illuminated (BSI) imaging sensors are an alternative to front side illuminated imaging sensors that address the fill factor problems associated with front side illumination. Backside illuminated imaging sensors include imaging arrays that are fabricated on the front surface of the semiconductor wafer, but receive light through a back surface of the wafer. Color filters and micro-lenses may be included on the back surface of the wafer in order to improve the sensitivity of the backside illuminated sensor. However, to detect visible light from the backside, the wafer are preferably extremely thin. The thickness of the wafer may also be reduced in order to improve the sensitivity. However, the thinner the wafer, the more susceptible it becomes to physical damage during the various manufacturing stages. That is, as the semiconductor wafer is thinned, the more easily it can be broken.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIG. 3B is an expanded view of the reinforced pad structure of FIG. 3A.

FIG. 3C is a bottom view of the reinforced pad structure of FIG. 3B.

FIG. 4B is an expanded view of the reinforced pad structure of FIG. 4A.

FIG. 4C is a bottom view of the reinforced pad structure of FIG. 4B.

DETAILED DESCRIPTION

Embodiments of a Backside Illuminated Imaging Sensor with Reinforced Pad Structure are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In short, embodiments of the present invention include a backside illuminated imaging sensor with openings for wire bonding to metal pads. A frame is disposed within the openings to strengthen the metal pads enough to withstand wire bond pulling, shear testing, or other various bonding techniques. These and other embodiments are described in detail below.

Figure 1:
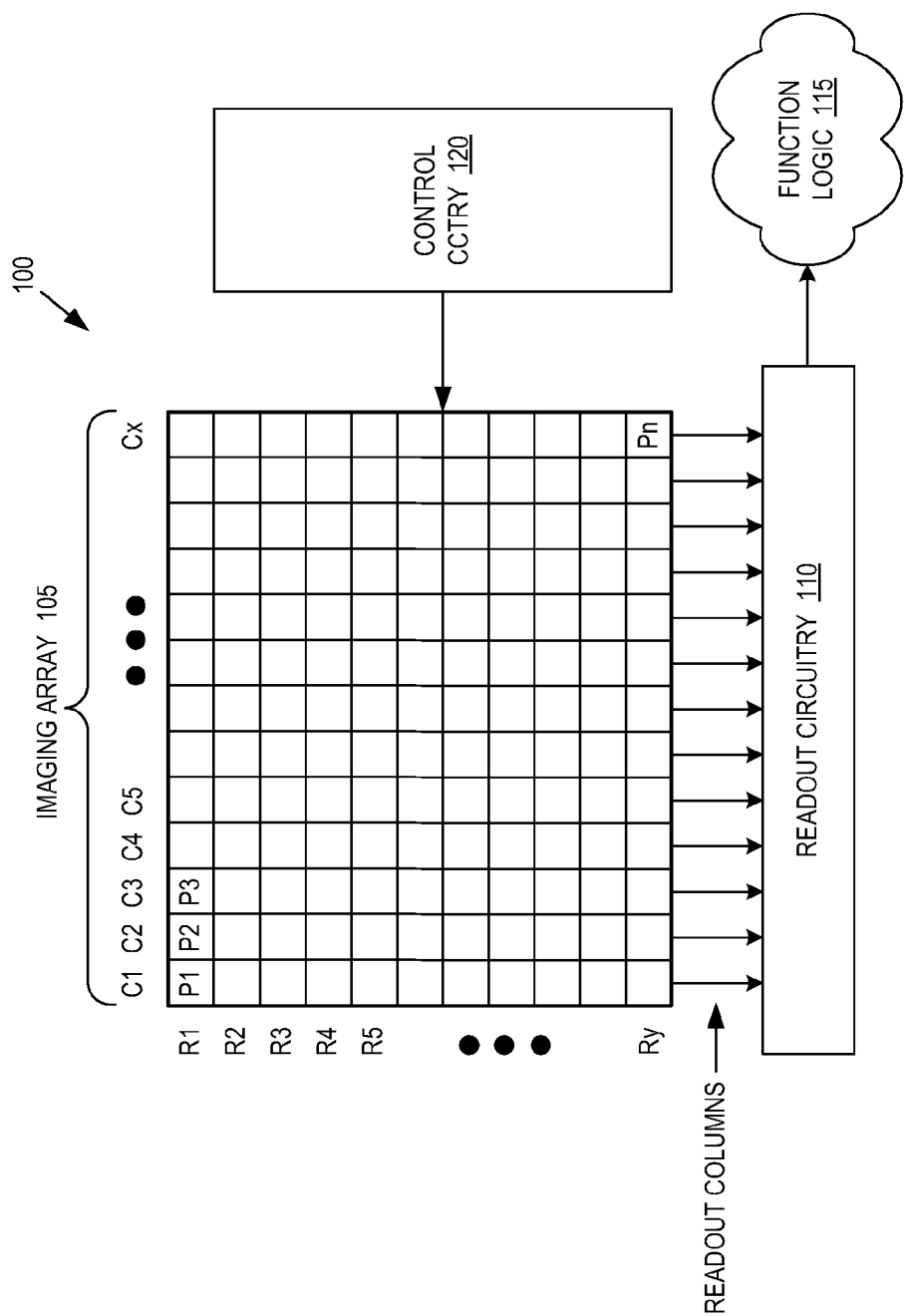
FIG. 1 is a block diagram illustrating a backside illuminated imaging sensor, in accordance with an embodiment of the invention

FIG. 1 is a block diagram illustrating a backside illuminated imaging sensor 100, in accordance with an embodiment of the invention. The illustrated embodiment of imaging sensor 100 includes a imaging array 105, readout circuitry 110, function logic 115, and control circuitry 120.

Imaging array 105 is a two-dimensional ("2D") array of backside illuminated imaging sensors or pixels (e.g., pixels P1, P2 . . . , Pn). In one embodiment, each pixel is an active pixel sensor ("APS"), such as a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

In operation, after each pixel has acquired its image data or image charge, the image data is readout by readout circuitry 110 and transferred to function logic 115. Readout circuitry 110 may include amplification circuitry, analog-to-digital conversion circuitry, or otherwise. Function logic 115 may simply store the image data or even manipulate the image data by applying post image effects (e.g., crop, rotate, remove red eye, adjust brightness, adjust contrast, or otherwise). In one embodiment, readout circuitry 110 may readout a row of image data at a time along readout column lines (illustrated) or may readout the image data using a variety of other techniques (not illustrated), such as a serial readout or a full parallel readout of all pixels simultaneously.

Control circuitry 120 is coupled to imaging array 105 to control operational characteristic of imaging array 105. For example, control circuitry 120 may generate a shutter signal for controlling image acquisition.

Figure 2A:
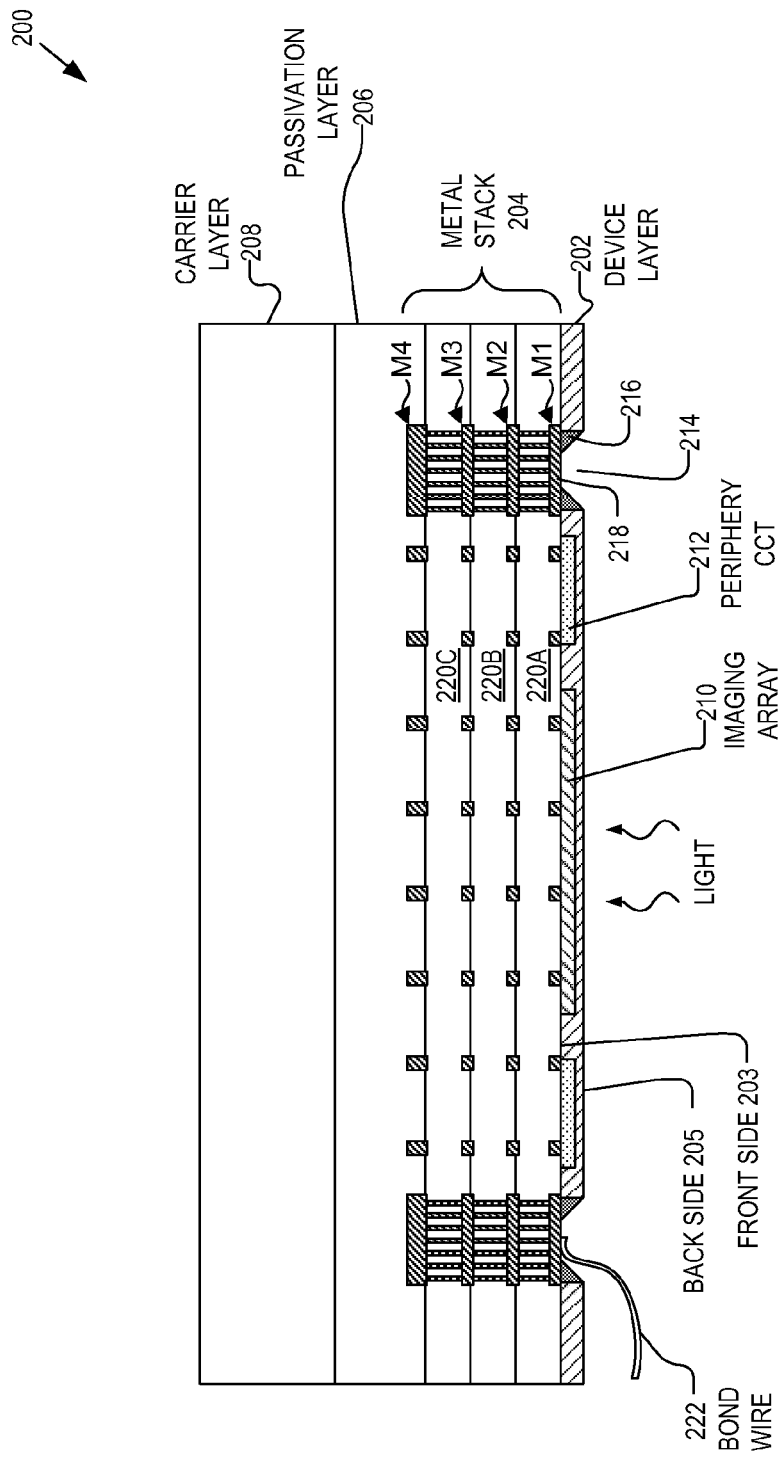
FIG. 2A is a cross-sectional view of a backside illuminated imaging sensor with a reinforced pad structure, in accordance with an embodiment of the invention.

FIG. 2A is a cross-sectional view of a backside illuminated imaging sensor 200 with a reinforced pad structure, in accordance with an embodiment of the invention. Imaging sensor 200 is one possible implementation of imaging sensor 100, shown in FIG. 1. The illustrated example of imaging sensor 200 includes a device layer 202, a metal stack 204, a passivation layer 206, a carrier layer 208, a reinforcing frame 216, and a bond wire 222. Device layer 202 is illustrated as including an imaging array 210, periphery circuitry 212, and an opening 214. Metal stack 204 is illustrated as including metal interconnect layers M1-M4 and intermetal dielectric layers 220A-220C. Metal interconnect layer M1 is illustrated as including a metal pad 218.

In the illustrated embodiment of FIG. 2A, imaging array 210 is formed in a front side 203 and is configured to receive light from a back side 205 of device layer 202. In one embodiment, device layer 202 is a silicon substrate or wafer for forming imaging array 210 and periphery circuitry 212 therein. Imaging array 210 may include an array of imaging pixels arranged in a plurality of rows and columns (e.g., imaging array 105 shown in FIG. 1). Periphery circuitry 212 may include readout circuitry 100, function logic 115, and control circuitry 120, also as shown in FIG. 1. Optionally included in imaging sensor 200 are color filters (not shown) to implement a color imaging sensor and micro-lenses (also not shown) to focus light onto pixels of imaging array 210. Both the optional color filters and micro-lenses may be coupled to the backside 205 of device layer 202.

Also illustrated in the embodiment of FIG. 2A, is carrier layer 208 coupled to passivation layer 206 to provide structural support to imaging sensor 200. It is noted that the illustrated embodiment of imaging sensor 200 shown in FIG. 2A is not drawn to scale. For example, carrier layer 208 may have a thickness that is much greater than that of device layer 202. By way of example, carrier layer 208 may be on the order of 100 times thicker than device layer 202. In one embodiment, carrier layer 208 is fabricated separately and then bonded to passivation layer 206 by a method such as press-bonding.

As shown in FIG. 2A, imaging sensor 200 includes metal stack 204 coupled to the front side 203 of device layer 202. The illustrated embodiment of metal stack 204 includes four metal interconnect layers M1, M2, M3, and M4 separated by intermetal dielectric layers 220A, 220B, and 220C, respectively. Although FIG. 2A illustrates a four layer metal stack, metal stack 204 may include more or less layers for routing signals above the front side of device layer 202. In one embodiment metal interconnect layers M1, M2, M3, and M4 are a metal such as tungsten, aluminum, copper, aluminum-copper alloy, or other alloys.

In operation, the metal interconnect layers route electrical signals that are generated by the pixels of imaging array 210 and electrically connect periphery circuitry 212 to imaging array 210. The metal interconnect layers may also route electrical signals received from a device external to imaging sensor 200. For example, the metal interconnect layers may route a power signal or ground reference received from an external power supply. Additionally, the metal interconnect layers may route signals that are generated on imaging sensor 200 to a device external imaging sensor 200. For example, the metal interconnect layers may route an image signal to another device.

In order to access the metal interconnect layers for electrically coupling to an external device, an opening 214 is formed in device layer 202 to expose metal pad 218 of metal interconnect layer M1. In the illustrated embodiment a bond wire 222 is wire bonded or ball bonded to metal pad 218 to electrically connect imaging sensor 200 to another substrate or to a printed circuit board. For example, bond wire 222 may be bonded to metal pad 218 to electrically couple imaging sensor 200 to the metal leads of a chip carrier (not show) during packaging. However, during processing, device layer 202 is thinned to allow light to propagate from back side 205 through the device layer 202 to be received by imaging array 210. Opening 214 is defined within this thinned device layer 202 and may not provide enough structural support to maintain the integrity of metal pad 218 during various bonding techniques. Accordingly, embodiments of the present invention provide a reinforced pad structure by, for example, forming a reinforcing frame 216 within opening 214.

Figures 2B, 2C:
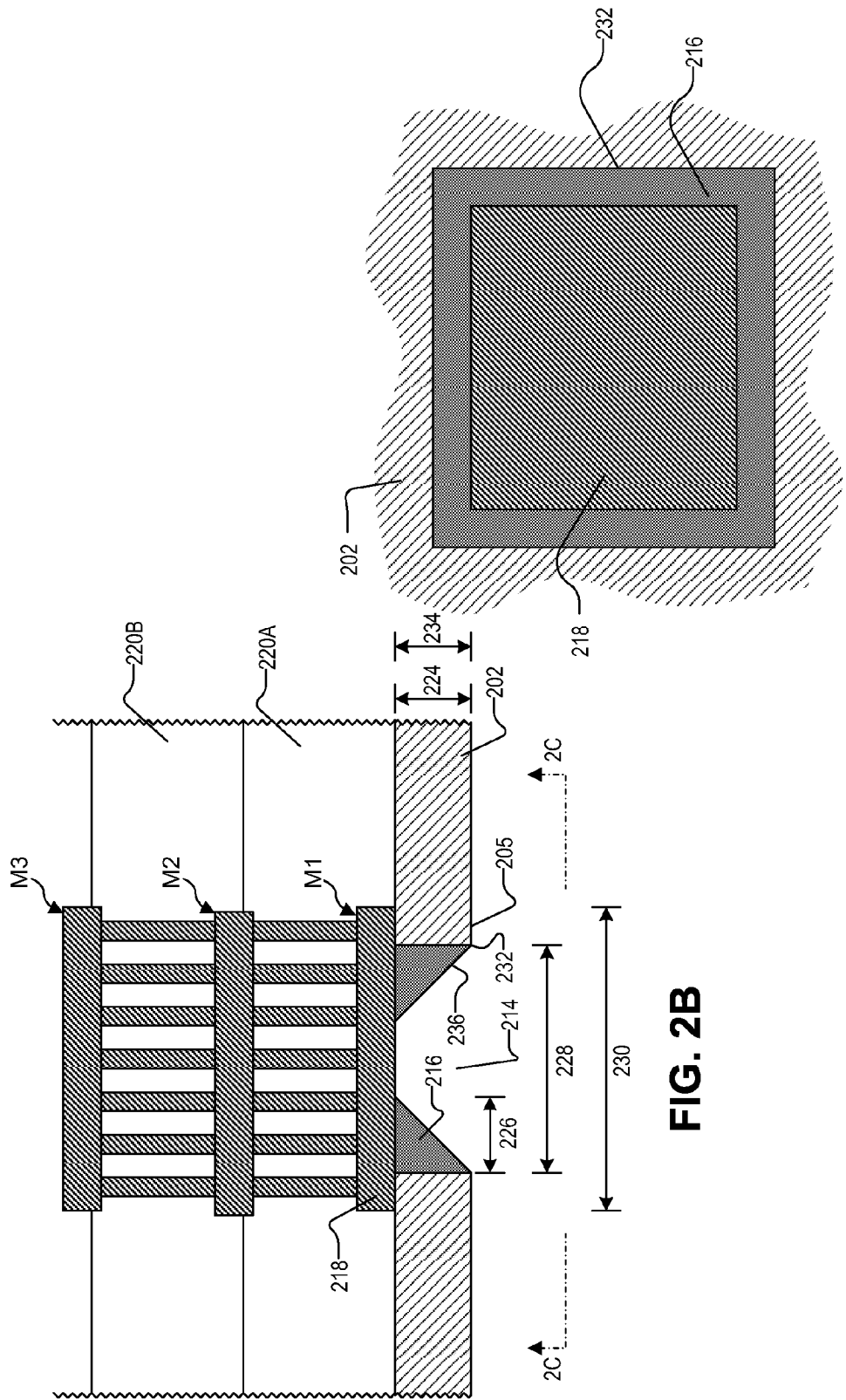
FIG. 2B is an expanded view of the reinforced pad structure of FIG. 2A.
FIG. 2C is a plan view or bottom plan view of the reinforced pad structure of FIG. 2B.

In one embodiment, reinforcing frame 216 is formed by depositing a reinforcing film (e.g., a metal, a nitride, or an oxide) on back side 205 after opening 214 has been formed. The reinforcing film is then etched to form frame 216 having a substantially frame shape. FIG. 2B is an expanded view of the reinforced pad structure of FIG. 2A and FIG. 2C is a bottom plan view of the reinforced pad structure of FIG. 2B. As shown in FIGS. 2B and 2C, reinforcing frame 216 has a substantially frame shape that adjoins a periphery 232 of opening 214, while also exposing an inner portion of metal pad 218. FIG. 2B illustrates opening 214 as having a height 224 and a width 228. In one embodiment, reinforcing frame 216 has a width 226 and height 234 that are substantially equal. Width 226 of reinforcing frame 216 may also be substantially equal to height 224 of opening 214. In another embodiment, width 226 of reinforcing frame 216 may be substantially equal to a thickness of device layer 202 (e.g., illustrated in FIG. 2C also as height 224). As mentioned above, frame 216 is formed by first depositing a reinforcing film on back side 205 and then etching the film to form the frame shape. In one embodiment, the film is etched using an isotropic etching technique. Thus, the resultant reinforcing frame 216 may include an angled surface 236 as shown in FIG. 2B. As illustrated in FIG. 2B, angled surface 236 is an inner surface of reinforcing frame 216 and extends between metal pad 218 and back side 205 of device layer 202 at periphery 232 of opening 214.

It is noted that the illustrated embodiment of the reinforced pad structure shown in FIGS. 2B and 2C are not drawn to scale. For example, width 228 of opening 214 may be in the range of 100 μm while width 226 of reinforcing frame 216 may be in the range of 1 μm.

Figure 3A:
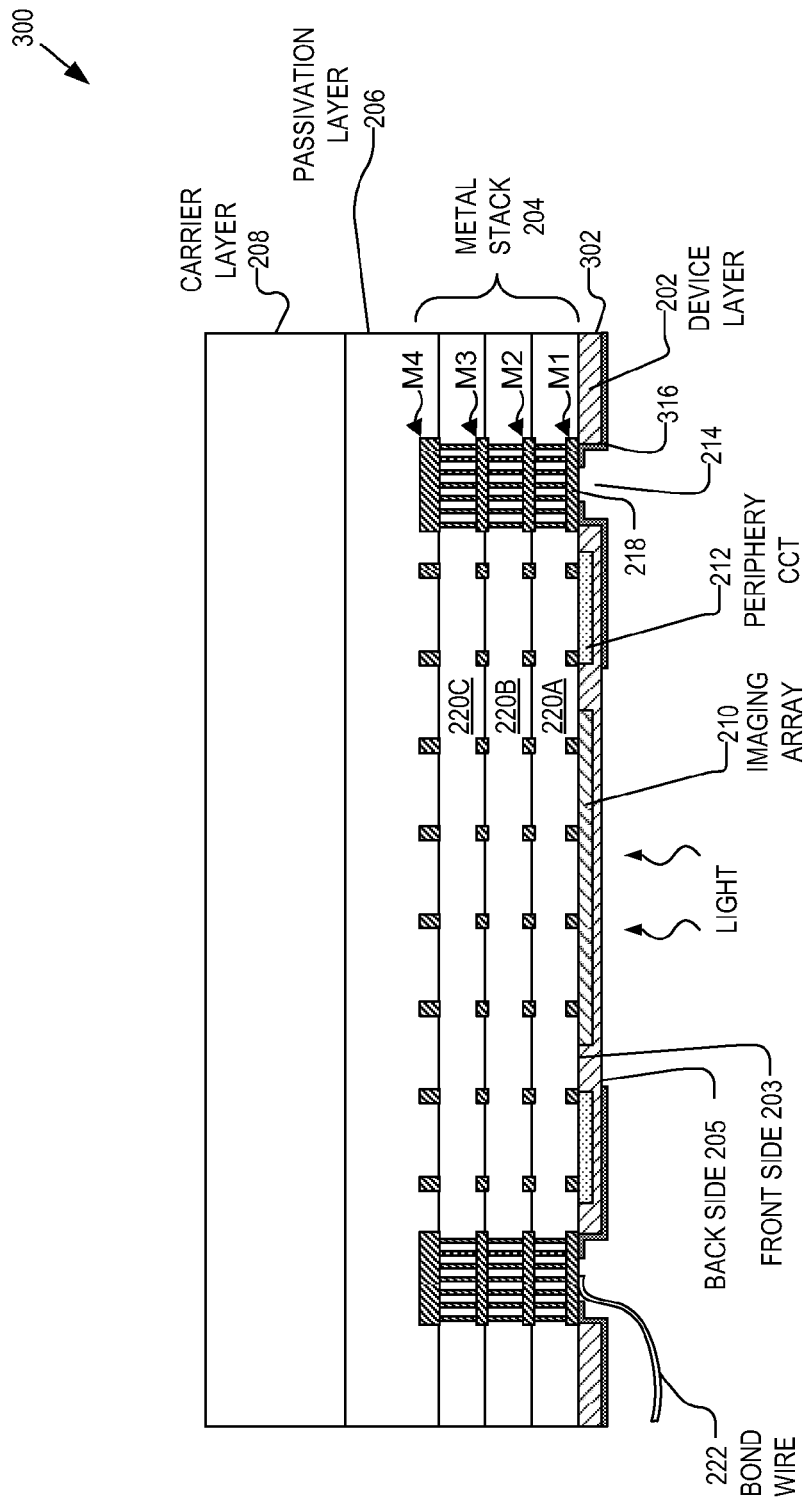
FIG. 3A is a cross-sectional view of a backside illuminated imaging sensor with a reinforced pad structure, in accordance with an embodiment of the invention.

FIG. 3A is a cross-sectional view of a backside illuminated imaging sensor 300 with a reinforced pad structure, in accordance with an embodiment of the invention. Imaging sensor 300 is one possible implementation of imaging sensor 100, shown in FIG. 1. The illustrated example of imaging sensor 300 includes device layer 202, metal stack 204, passivation layer 206, carrier layer 208, a reinforcing frame 316, and bond wire 222.

The illustrated embodiment of imaging sensor 300 includes reinforcing frame 316 that is formed using an additional masking step to further reinforce metal pad 218. In one embodiment, reinforcing frame 316 is formed by depositing a reinforcing film (e.g., a metal, a nitride, or an oxide) on back side 205 after opening 214 has been formed. A mask is then formed and the reinforcing film is then etched to form frame 316. FIG. 3B is an expanded view of the reinforced pad structure of FIG. 3A and FIG. 3C is a bottom plan view of the reinforced pad structure of FIG. 3B. As shown in FIG. 3C, reinforcing frame 316 is formed to expose an inner portion of metal pad 218. FIG. 3B illustrates the exposed portion of metal pad 218 as having a width 328 which may be less than the width 228 of opening 214. In one embodiment, the additional masking step for forming reinforcing frame 316 allows the frame to extend further into the inner region of metal pad 218 (i.e., allows width 328 to be smaller than width 228). A decreased width 328 of the exposed portion of metal pad 218 provides for more reinforcement of the metal pad while also allowing sufficient area for wire bonding to metal pad 218.

As shown in FIG. 3B, reinforcing frame 316 includes a first horizontal portion 316A, a vertical portion 316B, and a second horizontal portion 316C. As discussed above, width 328 can be adjusted by masking more or less of first horizontal portion 316A. In addition, the amount of second horizontal portion 316C that is disposed on back side 205 of device layer 202 may be controlled by the same masking step. For example, referring now back to FIG. 3A, reinforcing frame 316 may be formed by masking the reinforcing film such that reinforcing frame 316 extends on back side 205 of device layer 202. In one embodiment, reinforcing frame 316 extends on back side 205 of device layer 202 beneath periphery circuitry 212. Reinforcing frame 316 may also extend on back side 205 of device layer 202 to an outer edge 302 of device layer 202.

As discussed above, reinforcing frame 316 may be a nitride or an oxide. Thus, in one embodiment, reinforcing frame 316 is disposed within opening 214 and/or on back side 205 of device layer 202 to prevent bond wire 222 from electrically contacting device layer 202 (i.e., to electrically insulate device layer 202 from bond wire 222).

Figure 4A:
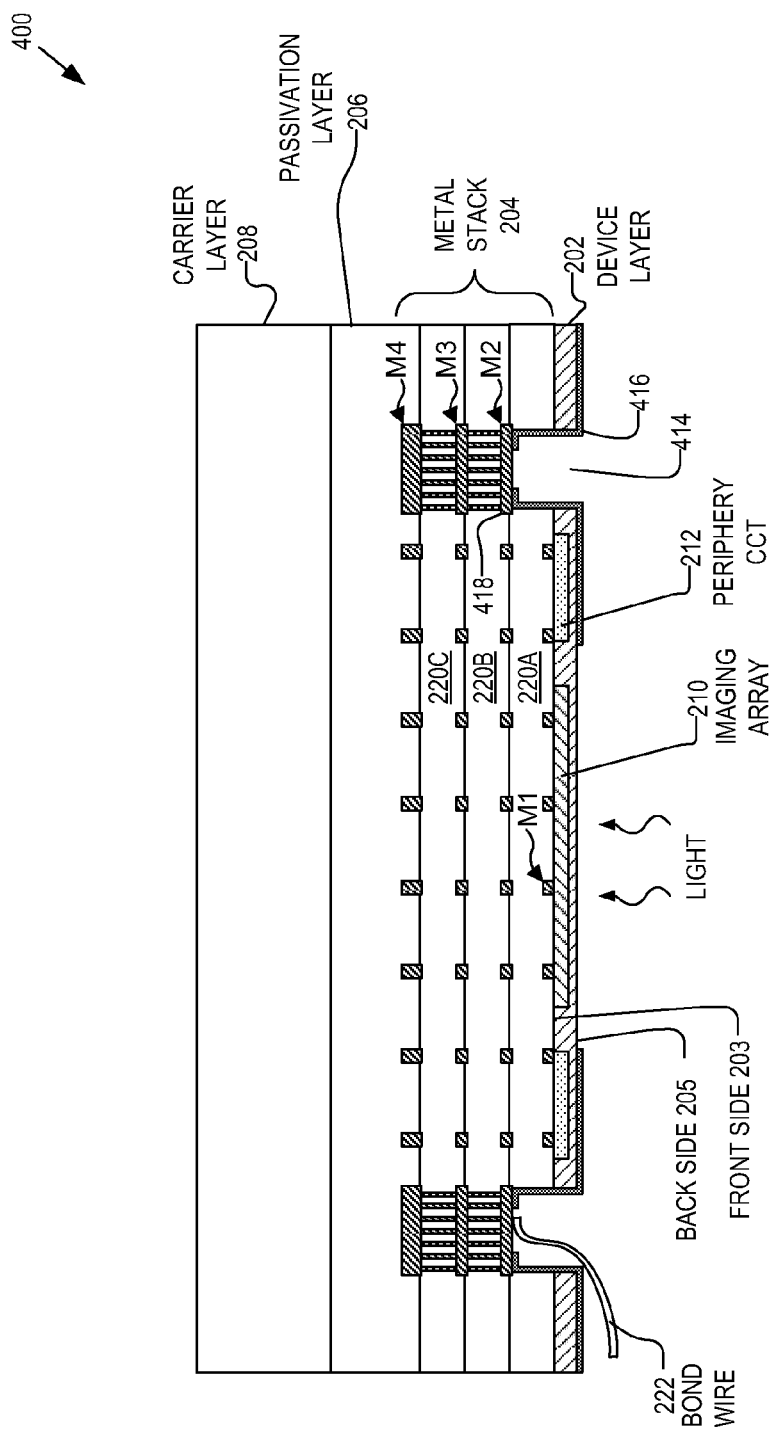
FIG. 4A is a cross-sectional view of a backside illuminated imaging sensor with a reinforced pad structure, in accordance with an embodiment of the invention.

FIG. 4A is a cross-sectional view of a backside illuminated imaging sensor with a reinforced pad structure, in accordance with an embodiment of the invention. Imaging sensor 400 is one possible implementation of imaging sensor 100, shown in FIG. 1. The illustrated example of imaging sensor 400 includes a device layer 402, metal stack 204, passivation layer 206, carrier layer 208, a reinforcing frame 416, and bond wire 222. Device layer 402 is illustrated as including imaging array 210, periphery circuitry 212, and an opening 414.

In the illustrated embodiment of FIG. 4A, opening 414 extends from back side 205 of device layer 202, through absent metal interconnect layer M1 and intermetal dielectric 220A, to metal pad 418 of metal interconnect layer M2.

The illustrated embodiment of imaging sensor 400 includes reinforcing frame 416 that is formed using the additional masking step to further reinforce metal pad 418. In one embodiment, reinforcing frame 416 is formed by depositing a reinforcing film (e.g., a metal, a nitride, or an oxide) on back side 205 after opening 414 has been formed. A mask is then formed and the reinforcing film is then etched to form frame 416. FIG. 4B is an expanded view of the reinforced pad structure of FIG. 4A and FIG. 4C is a bottom plan view of the reinforced pad structure of FIG. 4B. As shown in FIG. 4B, reinforcing frame 416 extends the entire depth 424 of opening 414 and may electrically insulate the surface of device layer 202 while also structurally reinforcing metal pad 418 of metal interconnect layer M2.

Figure 5:
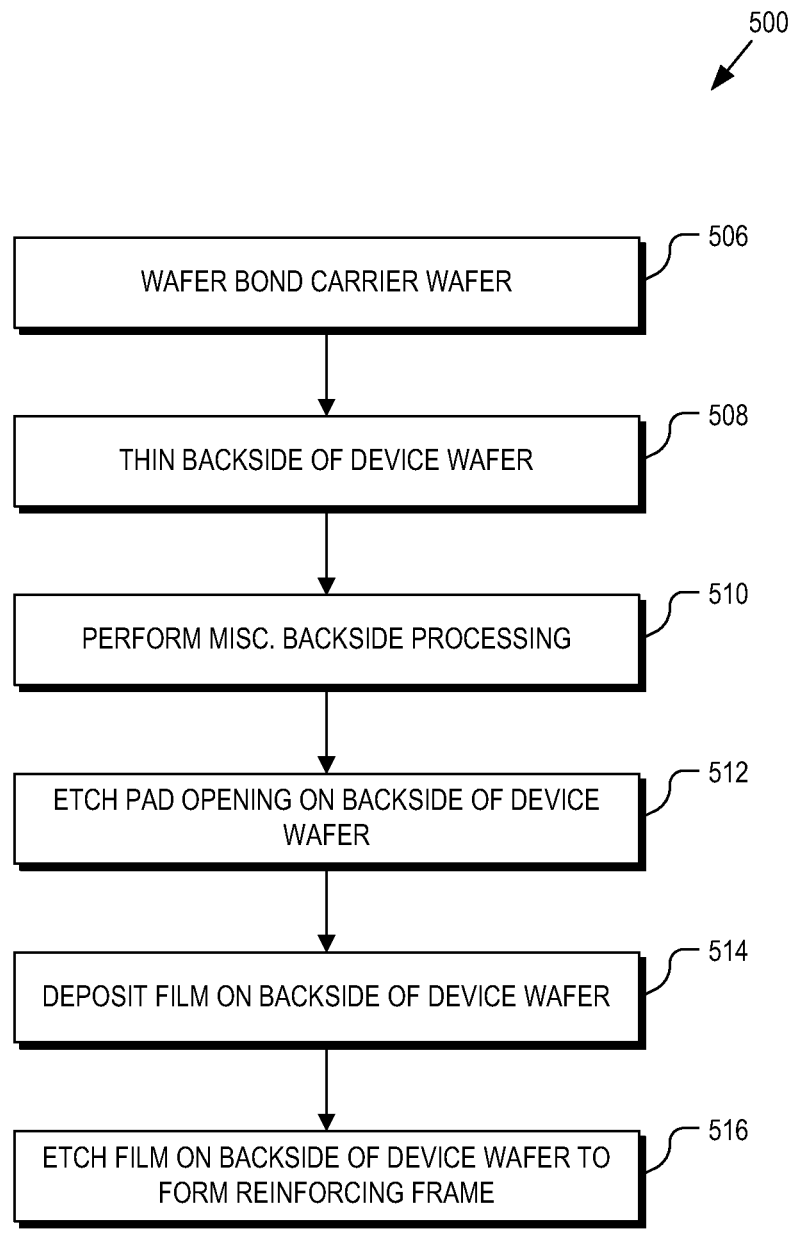
FIG. 5 is a flow chart illustrating a method of fabricating a backside illuminated imaging sensor with a reinforced pad structure, in accordance with an embodiment of the invention.

FIG. 5 is a flow chart illustrating a method 500 of fabricating a backside illuminated imaging sensor with a reinforced pad structure, in accordance with an embodiment of the invention. Method 500 is described with reference to FIG. 5 and FIG. 2A.

In a process block 506, a carrier wafer (e.g., carrier layer 208) is wafer bonded to provide structural support to the imaging sensor before thinning back side 205 of device layer 202. In one embodiment, carrier layer 208 is bonded to passivation layer 206 by a method such as press-bonding. Back side 205 of device layer 202 is then thinned in a process block 508. Device layer 202 may be thinned to a thickness in the range of approximately 1 um to approximately 10 um (e.g., see thickness dimension 234 in FIG. 2B).

In a process block 510 any miscellaneous backside processing may be performed. For example, any backside implantations or anneals may be performed in process block 510. Next, in a process block 512 pad openings are etched on the back side of device layer. In the embodiment of FIGS. 2A and 3A, pad opening 214 is etched through device layer 202 to expose metal pad 218 of metal interconnect layer M1. In the embodiment of FIG. 4A, pad opening 414 is etched through device layer 202, metal interconnect layer M1, and intermetal dielectric 22A to expose metal pad 418 of metal interconnect layer M2.

Next, in a process block 514, a reinforcing film is deposited on the back side 205 of device layer 202 and within the pad openings formed in process block 512. As discussed above, the reinforcing film may be a metal, an oxide, or a nitride. In a process block 516 the reinforcing film is etched to form reinforcing frame 216.

Figure 6:
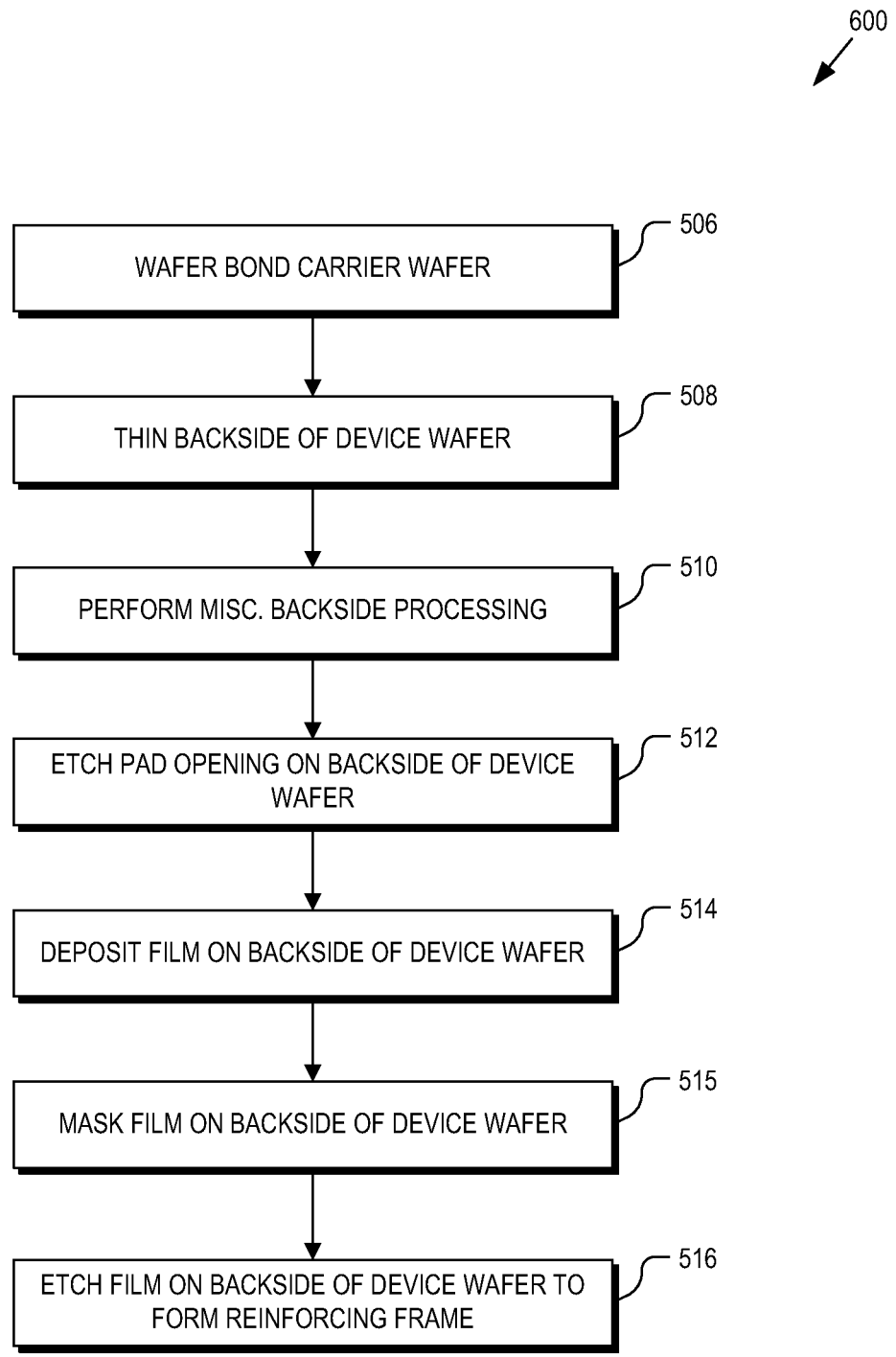
FIG. 6 is a flow chart illustrating a method of fabricating a backside illuminated imaging sensor with a reinforced pad structure, in accordance with an embodiment of the invention.

FIG. 6 is a flow chart illustrating a method 600 of fabricating a backside illuminated imaging sensor with a reinforced pad structure, in accordance with an embodiment of the invention. Method 600 is similar to method 500 discussed above, but includes an additional masking process prior to etching to form a reinforcing frame such as reinforcing frame 316 of FIG. 3A or reinforcing frame 416 of FIG. 4A. In a process block 515 the reinforcing film is masked on the back side 205 of device layer 202. Thus, by masking more or less of the deposited reinforcing film, the amount of exposed metal pad (i.e., metal pads 318 or 418) can be controlled. Additionally, the addition of a mask allows the formation of reinforcing frame on the back side 205 of device layer 202 in areas other than beneath imaging array 210.

The order in which some or all of the process blocks appear in each of the above processes should not be deemed limiting. Rather, one of ordinary skill in the art having the benefit of the present disclosure will understand that some of the process blocks may be executed in a variety of orders not illustrated.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method of fabricating a backside illuminated imaging sensor, the method comprising:
   providing a backside illuminated imaging sensor, the imaging sensor including:
   a device layer having an imaging array formed in a front side of the device layer, wherein the imaging array is adapted to receive light from a back side of the device layer;
   a metal stack coupled to the front side of the device layer, wherein the metal stack includes at least one metal interconnect layer having a metal pad; and an opening extending from the back side of the device layer to the metal pad to expose the metal pad for wire bonding;

depositing a film on the back side of the device layer and within the opening; and etching the film to form a frame within the opening to structurally reinforce the metal pad during wire bonding and to electrically insulate a bond wire from the back side of the device layer.

2. The method of claim 1, wherein etching the film comprises etching the film to form the frame having a height and a width that are substantially equal to a height of the opening.

3. The method of claim 2, wherein etching the film comprises etching the film to expose the metal pad such that the frame adjoins a periphery of the opening.

4. The method of claim 2, further comprising masking the film before etching the film.

5. The method of claim 2, wherein depositing the film comprises depositing a metal, a nitride or an oxide on the back side of the device layer.

6. The method of claim 2, further comprising wire bonding the bond wire to the metal pad within the opening.

7. The method of claim 6, wherein bonding the bond wire to the metal pad includes bonding the bond wire to a first side of the metal pad and wherein the frame is disposed on at least a portion of the first side of the metal pad.

* * * * *